United States Patent
Urashima et al.

(10) Patent No.: US 7,473,988 B2
(45) Date of Patent: Jan. 6, 2009

(54) WIRING BOARD CONSTRUCTION INCLUDING EMBEDDED CERAMIC CAPACITORS(S)

(75) Inventors: Kazuhiro Urashima, Kounan (JP); Shinji Yuri, Kasugai (JP); Manabu Sato, Nagoya (JP); Jun Otsuka, Konan (JP)

(73) Assignee: NGK Spark Plug Co., Ltd, Aichi (JP)

( * ) Notice: Subject to any disclaimer, the term of this patent is extended or adjusted under 35 U.S.C. 154(b) by 132 days.

(21) Appl. No.: 11/513,249

(22) Filed: Aug. 31, 2006

(65) Prior Publication Data
US 2007/0045815 A1    Mar. 1, 2007

(30) Foreign Application Priority Data
Sep. 1, 2005    (JP) ............................... 2005-254029
Jul. 20, 2006    (JP) ............................... 2006-198796

(51) Int. Cl.
*H01L 23/495*    (2006.01)
(52) U.S. Cl. ................................ 257/668; 257/E23.036
(58) Field of Classification Search .................. 257/698
See application file for complete search history.

(56) References Cited

U.S. PATENT DOCUMENTS

| 6,458,734 | B1 * | 10/2002 | Sugimoto et al. ........... 501/139 |
| 7,002,075 | B2 | 2/2006 | Kambe et al. |
| 7,235,477 | B2 * | 6/2007 | Ogawa ........................ 438/622 |
| 2002/0027282 | A1 | 3/2002 | Kawakami et al. |
| 2002/0033378 | A1 * | 3/2002 | Hayashi et al. ............... 216/11 |
| 2002/0159243 | A1 * | 10/2002 | Ogawa et al. ............... 361/760 |
| 2004/0027813 | A1 | 2/2004 | Li |

FOREIGN PATENT DOCUMENTS

JP    2002-43754    2/2002

* cited by examiner

*Primary Examiner*—Wai-Sing Louie
*Assistant Examiner*—Bilkis Jahan
(74) *Attorney, Agent, or Firm*—Stites and Harbison PLLC; Ross F. Hunt, Jr.

(57) ABSTRACT

A wiring board includes a substrate core, ceramic capacitors and a built-up layer. The substrate core has a housing opening portion therein which opens at a core main surface. The ceramic capacitors are accommodated in the housing opening portion and oriented such that the core main surface and a capacitor main surface of each capacitor face the same way. The built-up layer includes semiconductor integrated circuit element mounting areas at various locations on a surface thereof. In the substrate core, each ceramic capacitor is respectively disposed in an area corresponding to each semiconductor integrated circuit element mounting area.

11 Claims, 8 Drawing Sheets

Fig. 14

WIRING BOARD CONSTRUCTION INCLUDING EMBEDDED CERAMIC CAPACITORS(S)

FIELD OF THE INVENTION

The present invention is related to a wiring board of a construction wherein a ceramic capacitor is embedded in a substrate core and a built-up layer is laminated on a surface of the substrate core on which a semiconductor integrated circuit element is mounted.

BACKGROUND OF THE INVENTION

In recent years, the semiconductor integrated circuit elements (IC chips) used for a CPU in a computer or the like operate at higher speeds, and with higher level functional features, than previously. Along with this advance, the number of terminals has increased and the terminal interval has tended to be smaller or more narrow. Generally speaking, terminals in large numbers are densely packed on the bottom surface of the IC chip in an array, and a terminal block so formed is connected to a terminal block at the motherboard side by a conventional "flip chip" connection. However, because there is a large difference in pitch between the terminal block at the IC chip side and the terminal block at the motherboard side, it is difficult to directly connect the IC chip to the motherboard. Therefore, the connection method generally employed is one wherein a package constituted by the IC chip, which is mounted on a wiring board for mounting the IC chip, is produced and then mounted on the motherboard. Examples of such wiring boards which constitute this type of package include a wiring board wherein a ceramic chip is embedded in a core substrate comprised of a polymer material so as to form a core portion, and a built-up layer is formed on both the top and rear surfaces of the core portion (e.g., see Japanese Patent Application Laid-Open (kokai) No. 2005-39243).

Recently, the strong demand for a system capable of offering higher performance than a package including only a single microprocessor has been increasing. One example of such a system is a package including a plurality of microprocessors. This type of package includes a multi-microprocessor structure which is capable of performing parallel processing of plural threads (tasks), something which a single microprocessor structure cannot perform, and results in improving the processing capacity of the entire system. Further, the multi-microprocessor structure has improved failure-resistance as compared with the single microprocessor structure.

When implementing a package having a multi-microprocessor structure, for example, the size of a ceramic capacitor of the wiring board corresponding to that disclosed in the above-identified reference is enlarged, and microprocessors are mounted at plural locations within an accommodation area of the enlarged ceramic capacitor. However, with this structure, there is a decrease in the available area in a substrate core for forming a conductor portion, such as a through-hole and a conductive pattern. Thus, wiring of the conductor portion used in electrically connecting the top and rear surfaces of a core portion presents difficulties, with the result that the overall size of the wiring board is unlikely to be decreased, as is desirable.

Further, the wiring board according to the above-described reference can be used as a component part of a package having a multi-microprocessor structure when the need for a plurality of power supply systems for the microprocessors can be met by a shared power supply system. However, when the power supply system cannot be a shared system, and it is thus necessary to establish a power supply system for every microprocessor, and each microprocessor cannot be fully operational, even though the wiring board is used as a component part of the overall package. Therefore, the advantages of a multi-microprocessor structure cannot be fully realized.

In this type of package, because the calorific power of the microprocessor also increases, it is very important to match the coefficients of thermal expansion of the microprocessor and the wiring board. In this regard, when the thermal expansion coefficients of the microprocessor and the wiring board do not match, there will be substantial heat stress imposed on the corresponding microprocessor, and cracking and a faulty connection may occur in the microprocessor. Therefore, it is necessary to adopt a construction which can reduce the influence of such heat stress.

SUMMARY OF THE INVENTION

In accordance with an important aspect thereof, the present invention addresses the above problems, and, in this regard, an object of the invention is to provide a wiring board which is capable of fully bringing out the advantages of a construction wherein a plurality of semiconductor integrated circuit elements are mounted on the wiring board, and to provide a wiring board which is also reduced in size and affords important advantages with respect to cost, performance and reliability.

According to one approach to solving the above-mentioned problems, there is provided a wiring board, comprising: a substrate core including a core main surface and a core rear surface; a plurality of ceramic capacitors each including a capacitor main surface and comprising an alternately laminated structure wherein a first inner electrode layer and a second inner electrode layer sandwich a ceramic dielectric layer therebetween, said ceramic capacitor being embedded in said substrate core and oriented such that said core main surface and said capacitor main surface face in a common direction; and a built-up layer having a laminated structure wherein at least one interlayer insulating layer and at least one conductor layer are alternately laminated on said core main surface and said capacitor main surface, the built-up layer including a plurality of semiconductor integrated circuit element mounting areas at different locations on a surface of said built-up layer, and said plurality of ceramic capacitors being disposed in areas of said substrate core which correspond to said plurality of semiconductor integrated circuit element mounting areas.

According to the wiring board of this embodiment, a plurality of semiconductor integrated circuit element mounting areas on which a semiconductor integrated circuit element may be mounted is provided in the built-up layer, and, in the substrate core, a plurality of ceramic capacitors are respectively disposed in the areas corresponding to a plurality of semiconductor integrated circuit element mounting areas. Preferably, a conductor portion, such as a through-hole conductor or a conductor pattern or the like, is formed in an area formed between adjoining ceramic capacitors. As a result, even though a construction is adopted which provides for mounting a plurality of semiconductor integrated circuit elements, a conductor layer is provided for establishing an electrical connection between the top and rear surfaces of the substrate core without any enlargement of the overall size of the wiring board.

Further, even if a power supply system for plural semiconductor integrated circuit elements cannot be shared and an individual power supply system for each semiconductor integrated circuit element is necessary, each semiconductor integrated circuit element can fully be operational because the plural ceramic capacitors are respectively electrically connected to the semiconductor integrated circuit element mounting areas. Therefore, in adopting a construction for mounting a plurality of semiconductor integrated circuit elements, the advantages of such a construction can be fully realized.

Further, according to this construction, each semiconductor integrated circuit element is supported on a respective ceramic capacitor. Thus, compared to the conventional construction wherein all of the semiconductor integrated circuit elements are supported on a single large ceramic capacitor, the influence of heat stress is reduced because the thermal expansion coefficient can be readily matched with the semiconductor integrated circuit element. Therefore, cracking and faulty connection of the semiconductor integrated circuit element due to high heat stress levels can be prevented.

As mentioned above, in the substrate core, a plurality of ceramic capacitors are respectively disposed in the areas corresponding to a plurality of semiconductor integrated circuit element mounting areas. The phrase "the areas corresponding to a plurality of semiconductor integrated circuit element mounting areas" as used here means an inner area that is present and corresponds to a plurality of semiconductor integrated circuit element mounting areas. More concretely, each ceramic capacitor is respectively disposed, in the inner area of the substrate core which is situated substantially directly below the corresponding semiconductor integrated circuit element mounting area. Each ceramic capacitor disposed in this way is disposed so that a part of, or the entire, ceramic capacitor may overlap the semiconductor integrated circuit element mounting area, as viewed in the thickness direction of the capacitor. In addition, the designer has some discretion in choosing the correlation in magnitude between the dimension of each ceramic capacitor as viewed in the thickness direction of the capacitor and the dimension of each semiconductor integrated circuit element mounting area. However, it is preferable that the former dimension be equal to or larger than the latter dimension.

Further, as used herein, "semiconductor integrated circuit element" principally means a semiconductor integrated circuit element used as a microprocessor, or the like, of a computer. The semiconductor integrated circuit element is, for example, flip chip connected to the semiconductor integrated circuit element mounting area. It is noted that "semiconductor integrated circuit element mounting area" essentially means an area where a terminal pad block is disposed on the surface of the built-up layer. Two or more semiconductor integrated circuit elements mounting areas may be provided (i.e., corresponding to the number of semiconductor integrated circuit elements).

The substrate core of the above-mentioned wiring board is a part of the core portion in the wiring board, and, in one preferred embodiment, is of a plate-like form or shape having a core main surface and a core rear surface opposed to the core main surface. The substrate core may include one or more housing opening portion(s) for accommodating the ceramic capacitor. The housing opening portion may be a "non-through-hole" which only opens at the core main surface, or may be a through-hole which opens at both the core main surface and core rear surface.

Although the material for forming the substrate core is not limited to the following, a preferable substrate core is principally comprised of a polymer material. Examples of suitable polymer materials for forming the substrate core include EP resin (epoxy resin), PI resin (polyimide resin), BT resin (bismaleimide triazine resin), PPE resin (polyphenylene ether resin), etc. Further, a composite material made of these resins and organic fibers, such as glass fiber (glass woven fabric and non-woven glass fabric) or polyamide fiber may also be employed.

The ceramic capacitor of the above-mentioned wiring board includes a capacitor main surface and a laminated structure wherein the first inner electrode layer and the second inner electrode layer are alternately laminated by sandwiching the ceramic dielectric layer therebetween. Preferably, the ceramic capacitor includes both the capacitor main surface and a capacitor rear surface which is located on the opposite side of the capacitor main surface. Such ceramic capacitor may include a capacitor formed such that a thin film layer made of ceramic material is laminated onto a substrate (i.e., a substrate other than ceramic substrate). The ceramic capacitor is embedded in the substrate core in an orientation wherein the core main surface and the capacitor main surface face in the same direction. The term "embedded" as used herein covers both a condition wherein at least a part of a ceramic capacitor is accommodated in the housing opening portion of the substrate core and a condition wherein the entire ceramic capacitor is accommodated in the housing opening portion of the substrate core. Further, the ceramic capacitor is preferably fixed by a filler made from, for example, a polymer material, so that the ceramic capacitor is embedded in the substrate core.

Although two or more ceramic capacitors may be provided, preferably the same number of capacitors is provided as the number of semiconductor integrated circuit element mounting areas. With this construction, all of the ceramic capacitors can be electrically connected to all semiconductor integrated circuit element mounting areas. Further, suitable examples of the ceramic capacitor include a via arrayed type of ceramic capacitor. This type of ceramic capacitor includes a plurality of via conductors for the supply of power which electrically connect the said first inner electrode layers, and a plurality of via conductors for ground which electrically connect the second inner electrode layers. The plural via conductors for the power supply and the plural via conductors for ground are preferably disposed in an overall array form. In employing this structure, a reduction in size of the ceramic capacitor can be achieved, resulting in a reduction in the overall size of the wiring board. Further, despite the compact size of the wiring board, high electrical capacity may be relatively easily secured, thereby resulting in a more stable power supply.

It is noted that when the substrate core has a plurality of housing opening portions therein which open at the core main surface, the ceramic capacitor is preferably accommodated in each housing opening portion in an orientation wherein the core main surface and the capacitor main surface face in the same direction. With this structure, it is easy to provide an area for forming a conductor portion such as a through-hole conductor or a conductor pattern in the area formed between adjoining housing opening portions. As a result, even though a structure that provides for mounting plural semiconductor integrated circuit elements is adopted, wiring of the conductor layer used for electrically connecting the top and rear surfaces of the substrate core is simplified. In this regard, the substrate core may include the abovementioned conductor portion, which is used for electrically connecting the core main surface and the core rear surface, in the area formed between the adjoining housing opening portions.

On the other hand, when the substrate core includes only a single housing opening portion therein, which opens at the core main surface, the plural ceramic capacitors are preferably accommodated in the housing opening portion in an orientation wherein the core main surface and the capacitor main surface face in the same direction. With this structure, it is relatively easy to form the substrate core because the same number of housing opening portions as that of the ceramic capacitor need not necessarily be formed when all of the ceramic capacitors are to be accommodated, hereby simplifying formation of the wiring board. It is noted that the substrate core may include the conductor portion, which is used for electrically connecting the core main surface and the core rear surface, in the area formed between adjoining ceramic capacitors. In this case, the area formed between adjoining ceramic capacitors is filled by the filler, and the conductor portion, which may be a through-hole conductor or a conductor pattern, is formed in the filler. The filler is preferably comprised of a resin material having an insulating characteristic.

The aforementioned conductor portion, which, as indicated above, may be a through-hole conductor or a conductive pattern, is preferably electrically connected to, for example, the conductor layer in the wiring board used for signals, i.e., a signal layer as opposed to a ground layer or power supply layer. In this case, improved design flexibility in designing the wiring on the wiring board is afforded. Alternatively, the conductor portion, such as a through-hole conductor or a conductive pattern, is preferably electrically connected to, for example, the conductor layer for ground. According to this structure, because increased shielding effectiveness can be obtained, interference between the ceramic capacitors can be reduced or prevented, and noise caused by the interference can be reduced. When the conductor portion is a through-hole conductor, plural through-hole conductors are preferably disposed in rows so that greater shielding may be attained. In addition, the conductor portion can be a dummy conductor layer, which is electrically connected to neither the conductor layers for signals, to the conductor layers for the power supply or to the conductor layers for ground.

A sintered body of high-temperature-firing ceramics, such as alumina, aluminum nitride, boron nitride, silicon carbide and silicon nitride, is preferably employed as a ceramic dielectric layer. Further, a sintered body of low-temperature-firing ceramics, such as a glass-ceramic formed in such a manner that inorganic ceramic fillers, such as alumina, are added to borosilicic acid system glass or lead borosilicate system glass, is preferably employed as a ceramic dielectric layer. In this case, it is also preferable to employ a sintered body of dielectric ceramics, such as barium titanate, lead titanate and strontium titanate, according to the particular application. When the sintered body of dielectric ceramics is employed, a ceramic capacitor with a large electrostatic capacitance can be expected.

Although the material for forming the first inner electrode layer and the second inner electrode layer is not particularly limited to the following, a metal which can be sintered simultaneously with ceramics such as, for example, nickel, molybdenum, tungsten, titanium or the like is suitable. In addition, when a sintered body of low-temperature-firing ceramics is adopted for use as the ceramic dielectric layer, copper, silver or the like can be employed as a material for forming the first inner electrode layer and the second inner electrode layer.

The ceramic capacitor may include a resistive element which is comprised of a material having a higher resistance value than the material constituting the first inner electrode layer and said second inner electrode layer. With this structure, for example, various potentials can be established within the same ceramic capacitor, thereby facilitating the incorporation of advanced features into the wiring board. When no resistive element is formed in the ceramic capacitor, the resistive element must be provided in a location separate from the ceramic capacitor in the substrate core, or provided at the built-up layer side, and this makes it more difficult to form the resistive element. In addition, a material for forming the resistive element may be a conductive material having a higher resistance value than that of the first inner electrode layer and the second inner electrode layer. Examples of such a material include a metal material, ceramic material or the like.

The built-up layer constituting the wiring board preferably has a laminated structure wherein an interlayer insulating layer, comprised mainly of a polymer material, and the conductor layer are alternately laminated. Although the built-up layer (first built-up layer) may be formed only on the core main surface and the capacitor main surface, a second built-up layer having a similar laminated structure where the interlayer insulating layer and the conductor layer are alternately laminated may be formed on the core rear surface and the capacitor rear surface. With this structure, an electric circuit can be formed not only in the first built-up layer but also in the second built-up layer, thereby facilitating the incorporation of much more advanced features into the wiring board.

It is noted that the built-up layer (first built-up layer) formed on the core main surface and the capacitor main surface includes a plurality of semiconductor integrated circuit element mounting areas in various different locations in the surface of the built-up layer. Since a semiconductor element can be mounted on such semiconductor integrated circuit element mounting area, the difference in thermal expansion coefficient with respect to the semiconductor integrated circuit element can be reduced, as compared with the case where the semiconductor integrated circuit element mounting area is formed on the substrate core. Thus, this structure enables a reduction in the influence of thermal stress imposed on the semiconductor integrated circuit element.

In addition, a dimension of the semiconductor integrated circuit element mounting area is preferably equal to or smaller than the corresponding dimension of the capacitor main surface of the corresponding ceramic capacitor. The semiconductor integrated circuit element mounting area is preferably located within the capacitor main surface of the corresponding ceramic capacitor as viewed in the thickness direction of the ceramic capacitor. With this structure, since the semiconductor integrated circuit element mounting area is located in the area directly above the ceramic capacitor, the semiconductor integrated circuit element mounted on the semiconductor integrated circuit element mounting area is supported by a ceramic capacitor having high rigidity and a small coefficient of thermal expansion. Therefore, the built-up layer is unlikely to deform in the semiconductor integrated circuit element mounting area, and is thereby able to stably support the semiconductor integrated circuit element mounted on the semiconductor integrated circuit element mounting area.

As described above, a dimension of the semiconductor integrated circuit element mounting area is preferably smaller than that of capacitor main surface of the corresponding ceramic capacitor. Preferably, the dimensions of the semiconductor integrated circuit element mounting area are 90%, or less, of the dimensions of the capacitor main surface, and, most preferably, between about 50% and 90%. When the dimensions of the semiconductor integrated circuit element mounting area are 90% or less, the semiconductor integrated circuit element can be easily and stably supported. Further, when the dimensions of the semiconductor integrated circuit element mounting area are 50% or more, the dimensions of the semiconductor integrated circuit element mounting area will not be too small.

Further features and advantages of the present invention will be set forth in, or apparent from, the detailed description of preferred embodiments thereof which follows.

DESCRIPTION OF THE PREFERRED EMBODIMENTS

A first embodiment for carrying out a wiring board of the present invention will be described in detail with reference to the drawings.

Figure 1:
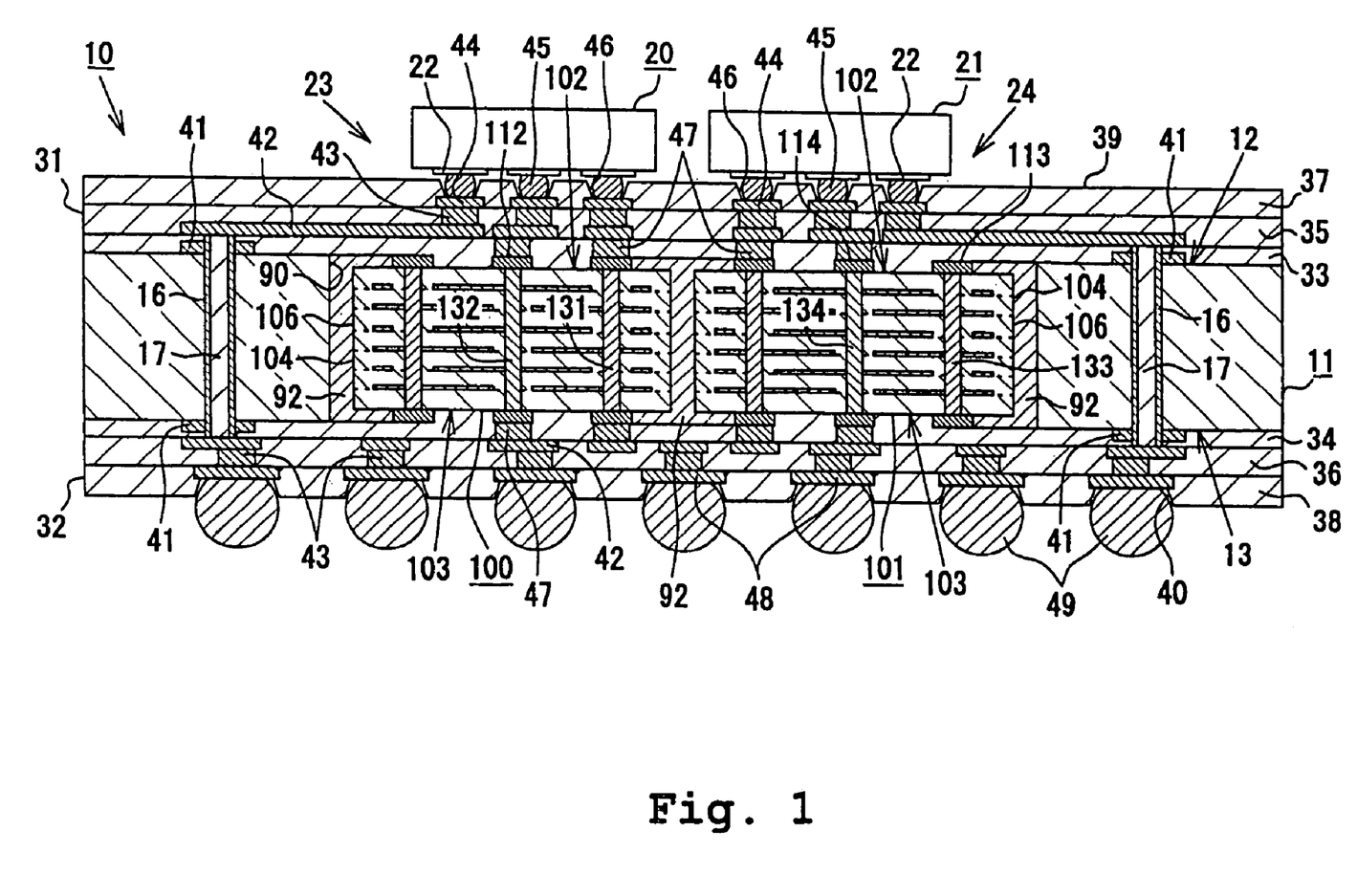
FIG. 1 is a schematic cross-sectional view showing a wiring board according to a first embodiment of the invention.

As shown in FIG. 1, a wiring board 10 according to the first embodiment is a wiring board for mounting an IC chip, and comprises: a substrate core 11 comprised of glass epoxy and of a generally rectangular shape; a first built-up layer 31 (referred to as a built-up layer) formed on an upper surface 12 (also referred to as a core main surface) of the substrate core 11; and a second built-up layer 32 formed on an lower surface 13 (core rear surface) of the substrate core 11. A through-hole conductor 16 is formed in each of plural locations in the substrate core 11. Each through-hole conductor 16 provides an electrical connection between the upper surface 12 and the lower surface 13 of the substrate core 11. In addition, the inside of each through-hole conductor 16 is filled with, for example, a plugging body 17, such as epoxy resin. Further, a conductor layer 41 comprised of copper is formed in a pattern on the upper surface 12 and the lower surface 13 of the substrate core 11 so that each conductor layer 41 may be electrically connected to a through-hole conductor 16.

The first built-up layer 31 formed on the upper surface 12 of the substrate core 11 has a laminated structure wherein resin insulating layers 33, 35 (which are each hereinafter referred to as an interlayer insulating layer) comprised of epoxy resin and a conductor layer 42 comprised of copper are alternately laminated. In this embodiment, the thermal expansion coefficient of the first built-up layer 31 is preferably about 30-40 ppm/° C., and, more preferably, about 35 ppm/° C. The thermal expansion coefficient of the first built-up layer 31 is defined as the average value of the measured value at between 30° C. and a glass-transition temperature (Tg).

A part of the conductor layer 42 formed on the surface of the resin insulating layer 33, and serving as a first layer, is electrically connected to an upper end of an associated through-hole conductor 16. Terminal pads 44 are formed at plural locations on the surface of the second resin insulating layer 35 in an array form. Further, the surface of the resin insulating layer 35 is almost entirely covered with a solder resist layer 37.

Openings 46 which expose the terminal pads 44 are formed at the predetermined locations of the solder resist layer 37. Plural solder bumps 45 are respectively disposed on the surfaces of associated terminal pads 44. Each solder bump 45 is electrically respectively connected to planar connection terminals 22 of IC chips 21, 22 (semiconductor integrated circuit element). The IC chips 20, 21, according to this embodiment, are of a rectangular plate-like form and are comprised of silicon having a thermal expansion coefficient of about 3.5 ppm/° C.

In addition, in the first built-up layer 31, each terminal pad 44 and each solder bump 45 is located within an area directly above a respective ceramic capacitor 100, 101. Each area serves as an IC chip mounting area, generally denoted 23 and 24 (also referred to as a semiconductor integrated circuit element mounting area). The IC chip mounting areas 23, 24 are formed in two separate locations on a top surface 39 of the first built-up layer 31. Further, the resin insulating layers 33, 35 each include via conductors 43, 47, respectively. Most of these via conductors 43, 47 are disposed on a common axis, and the conductor layers 41, 42 and the terminal pad 44 are electrically connected through the conductors 43, 47.

As shown in FIG. 1, the second built-up layer 32 formed on the lower surface 13 of the substrate core 11 has the almost same structure as that of the first built-up layer 31. In this regard, the second built-up layer 32 has a thermal expansion coefficient of about 30-40 ppm/° C. and has a laminated structure wherein resin insulating layers 34, 36 (hereinafter referred to as interlayer insulating layers) comprised of epoxy resin, and a conductor layer 42, are alternately laminated.

A part of conductor layer 42 formed on the lower surface of the resin insulating layer 34, and serving as the first layer, is electrically connected to the lower end of the associated through-hole conductor 16. A BGA pad 48, electrically connected to the conductor layer 42 through the via conductor 43, is formed at plural locations on the lower surface of the second resin insulating layer 36 in a lattice pattern. Further, the lower surface of the resin insulating layer 36 is almost entirely covered with a solder resist layer 38. Openings 40 which expose the BGA pads 48 are formed in predetermined locations of the solder resist layer 38. Plural solder bumps 49 for providing an electrical connection to a motherboard (not illustrated) are respectively disposed on the surfaces of the BGA pads 48. The wiring board 10 is mounted on the motherboard (not illustrated) through each solder bump 49.

The thermal expansion coefficient of the substrate core 11 is about 10-15 ppm/° C. in the planar direction (XY direction). The thermal expansion coefficient of the substrate core 11 is defined as the average value of the measured value at between 30° C. and a glass-transition temperature (Tg). The substrate core 11 has a rectangular-shaped housing opening portion 90, which is rectangular as viewed in plan and which opens at each center portion of the upper surface 12 and the lower surface 13. In other words, the housing opening portion 90 in this embodiment is a through-hole portion.

Figure 2:
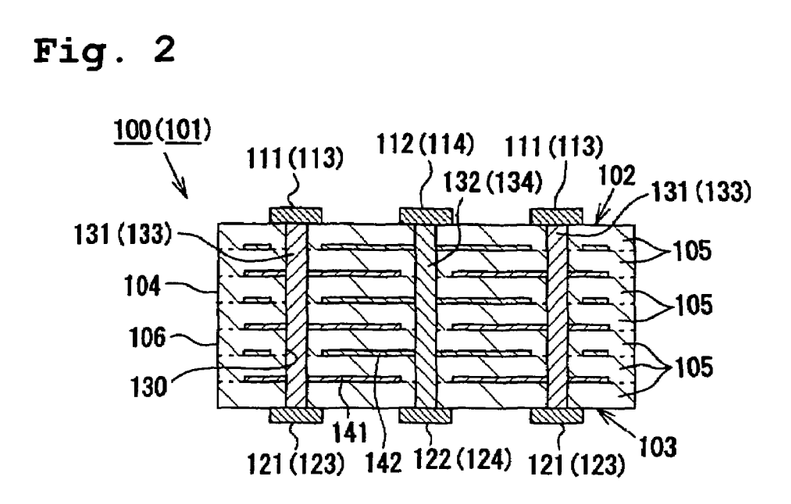
FIG. 2 is a schematic cross-sectional view of a ceramic capacitor.
Figure 3:
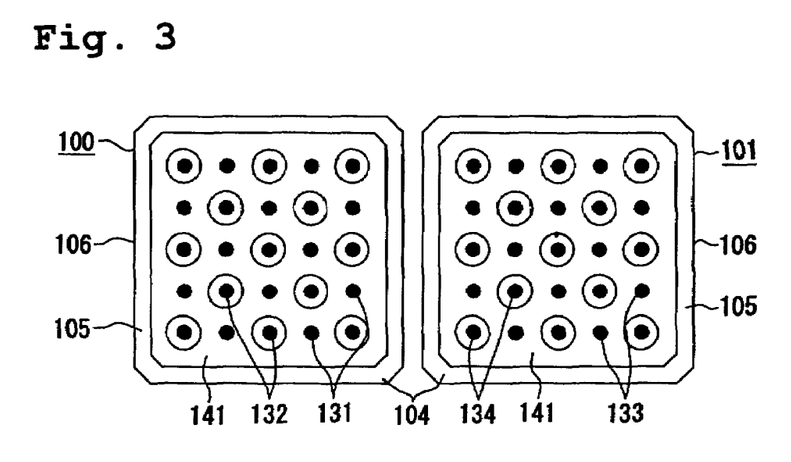
FIG. 3 is a schematic transverse cross-sectional view showing the connections in an inner layer of a ceramic capacitor.
Figure 4:
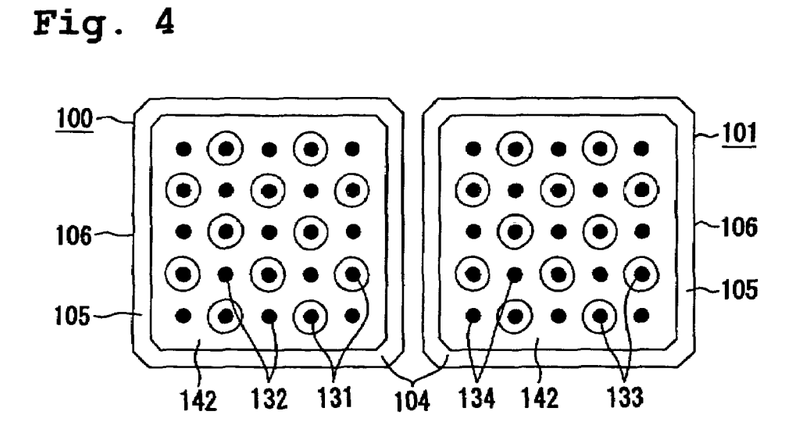
FIG. 4 is a view similar to FIG. 3 also showing the connections in an inner layer of a ceramic capacitor.

A pair of ceramic capacitors 100, 101, as illustrated, e.g., in FIGS. 2 to 4, are accommodated in the housing opening portion 90 so as to be embedded therein. In addition, the ceramic capacitors 100, 101 are accommodated next to each other and are oriented so that the upper surface 102 (capacitor main surface) of each faces in the same direction as the upper surface 12 of the substrate core 11.

The ceramic capacitors 100, 101 according to this embodiment are of a rectangular plate-like form having dimensions of 12.0 mm (vertical)×12.0 mm (lateral)×0.8 mm (thickness). In addition, the thickness of the ceramic capacitors 100, 101 is preferably between about 0.2 mm and 1.0 mm. When the thickness thereof is less than about 0.2 mm, the ceramic capacitors 100, 101 are unable to reduce the stress produced at the time of mounting the IC chips 20, 21 on the IC chip mounting areas 23, 24, and thus do not effectively function as a support. On the other hand, when the thickness of the ceramic capacitor is larger than about 1.0 mm, the thickness of the wiring board 10 is too great. More preferably, the thickness of the ceramic capacitors 100, 101 is between about 0.4 mm and 0.8.

In substrate core 11, the ceramic capacitor 100 is disposed in the area directly under the IC chip mounting area 23, and the ceramic capacitor 101 is disposed in the area directly below the IC chip mounting area 24. The dimensions of the IC chip mounting area 23 (also referred to as the face area at which the planar connection terminals 22 of the IC chip 20 are formed) are smaller than that of the upper surface area 102 of the corresponding ceramic capacitor 100. Similarly, the dimensions of the IC chip mounting area 24 (the face area at which the planar connection terminals 22 of the IC chip 21 are formed) are also smaller than the area of the upper surface 102 of the corresponding ceramic capacitor 101. As viewed in the thickness direction of the ceramic capacitor 100, 101, the IC chip mounting area 23 is encompassed within the upper surface 102 of the corresponding ceramic capacitor 100, and the IC chip mounting area 24 is encompassed within the upper surface 102 of the corresponding ceramic capacitor 101.

As shown in FIG. 1, a gap formed between the inner surface of the housing opening portion 90 and the side face 106 of the ceramic capacitor 100, 101 is filled with a filler 92. Filler 92 is preferably comprised of a polymer material (a thermosetting resin, such as epoxy resin, in this embodiment). The filler 92 fixes each ceramic capacitor 100, 101 to the substrate core 11 as well as serves the function of absorbing deformation in the planar direction, and the thickness direction, of both the ceramic capacitor 100, 101 and the substrate core 11, by virtue of its own elastic deformation. In addition, each ceramic capacitor 100, 101 is of a generally square shape as viewed in plan and includes a tapered portion having C 0.6 at each of the four corners thereof. Thus, when the filler 92 deforms due to a variation in temperature, the stress concentration at the corners of each ceramic capacitor 100, 101 is eased, thereby preventing cracking of the filler 92.

As shown in FIGS. 1-4, each of the ceramic capacitors 100, 101 according to this embodiment is a so-called "via array type ceramic capacitor." A ceramic sintered body 104 comprising the ceramic capacitors 100, 101 preferably has a thermal expansion coefficient which is equal to the mean value of the thermal expansion coefficient of the IC chips 20, 21 and that of the built-up layers 31, 32. More preferably, this value is close to the thermal expansion coefficient of the IC chips 20, 21. In this embodiment, the thermal expansion coefficient of the ceramic sintered body 104 is preferably about 8-12 ppm/° C., and, more preferably, about 9.5 ppm /° C. The thermal expansion coefficient of the ceramic sintered body 104 is defined as the average value of the measured value at between 30° C. and 250 degrees ° C.

The ceramic sintered body 104 is a plate-like member having the upper surface 102 and the lower surface 103 (capacitor rear surface). In addition, the resin insulating layer 33 constituting the first built-up layer 31 is formed on the upper surface 102 of the ceramic sintered body 104, and the resin insulating layer 34 constituting the second built-up layer 32 is formed on the lower surface 103 of the ceramic sintered body 104. The ceramic sintered body 104 has a laminated structure wherein a first internal electrode layer 141 and a second internal electrode layer 142 are alternately laminated by sandwiching a ceramic dielectric layer 105 therebetween. The ceramic dielectric layer 105 is comprised of a sintered body of barium titanate, which is one of a number of suitable high permittivity ceramics, and functions as a dielectric (insulator) between the first internal electrode layer 141 and the second internal electrode layer 142. The first internal electrode layer 141 and the second internal electrode layer 142 are principally comprised of nickel and are disposed alternately in the ceramic sintered body 104.

As shown in FIGS. 2-4, plural via holes 130 are formed in the ceramic sintered body 104 of the ceramic capacitor 100. These via holes 130 penetrate the ceramic sintered body 104 in the thickness direction and are disposed in a lattice pattern (an array form) over the whole surface. In each via hole 130, a plurality of via conductors 131, 132, principally comprised of nickel, are formed so as to communicate between the upper surface 102 and the lower surface 103 of the ceramic sintered body 104. Each first via conductor 131 for the power supply connections penetrates each first inner electrode layer 141 so that the first inner electrode layers 141 may be electrically connected to each other. Each first via conductor 132 for the ground connections penetrates each second inner electrode layer 142 so that the second inner electrode layers 142 may be electrically connected to each other. Each first via conductor 131 for the power supply and each first via conductor 132 for the ground are disposed in an overall array form. It is noted that while, for explanatory purposes, the arrays of via conductors 13,1, 132 are shown as 3×3 arrays in rows (or 5×5 arrays in rows), the actual arrays have more rows.

As shown in FIGS. 2-4, a plurality of first electrode terminals 111 for the power supply and a plurality of first electrode terminals 112 for the ground are formed on the upper surface 102 of the ceramic sintered body 104 of the ceramic capacitor 100 so as to protrude from the upper surface. Also, a plurality of first electrode terminals 121 for the power supply and a plurality of first electrode terminals 122 for the ground are formed on the lower surface 103 of the ceramic sintered body 104 of the ceramic capacitor 100 so as to protrude from the lower surface.

The electrode terminals 111, 112 disposed at the upper surface side are electrically connected to the via conductor 47. On the other hand, the electrode terminals 121, 122 disposed at the lower surface side are electrically connected to an electrode (terminal) of a motherboard (not illustrated) through the via conductor 47, the conductor layer 42, the via conductor 43, the BGA pad 48 and the solder bump 49.

Further, a generally centrally located portion of the bottom surface of the electrode terminals 111, 112 is directly connected to the end face of the via conductors 131, 132 at the upper surface side. The generally centrally located portion of the bottom surface of the electrode terminals 121,122 is directly connected to the end face of the via conductors 131, 132 at the lower surface side. Therefore, the electrode terminals 111, 121 for the power supply are electrically connected to the first via conductor 131 for the power supply and the first internal electrode layer 141, and the electrode terminals 112, 122 for the ground are electrically connected to the first via conductor 132 for the ground and the second internal electrode layer 142, respectively.

Similarly, a plurality of via holes 130 is also formed in the ceramic sintered body 104 of the ceramic capacitor 101 as shown in FIGS. 2-4. A plurality of via conductors 133, 134, principally comprised of nickel, is formed inside of each via hole 130 so as to communicate between the upper surface 102 and the lower surface 103 of the ceramic sintered body 104.

Each second via conductor 133 for the power supply penetrates each first inner electrode layer 141 so that the first inner electrode layers 141 may be electrically connected to each other. Each second via conductor 134 for the ground penetrates each second inner electrode layer 142 so that the second inner electrode layers 142 may be electrically connected to each other. Each second via conductor 133 for the power supply and each second via conductor 134 for the ground are disposed in an overall array. It is noted that although, for explanatory purposes, the via conductors 133, 134 are shown in 3×3 in arrays (or 5×5 arrays), the actual arrays, in practice, have more rows.

A plurality of second electrode terminals 113 for the power supply and a plurality of second electrode terminals 114 for the ground are formed on the upper surface 102 of the ceramic sintered body 104 of the ceramic capacitor 101 so as to protrude from the upper surface. Also, a plurality of second electrode terminals 123 for the power supply and a plurality of second electrode terminals 124 for the ground are formed on the lower surface 103 of the ceramic sintered body 104 of the ceramic capacitor 101 so as to protrude from the lower surface.

The electrode terminals 113, 114 disposed at the upper surface side are electrically connected to the via conductor 47. On the other hand, the electrode terminals 123, 124 disposed at the lower surface side are electrically connected to an electrode (terminal) of a motherboard (not illustrated) through the via conductor 47, the conductor layer 42, the via conductor 43, the BGA pad 48 and the solder bump 49.

Further, a generally centrally located portion of the bottom surface of the electrode terminals 113, 114 is directly connected to the end face of the via conductor 133, 134 at the upper surface side. The generally centrally located portion of the bottom surface of the electrode terminals 123, 124 is directly connected to the end face of the via conductor 133, 134 at the lower surface side. Therefore, the electrode terminals 113, 123 for the power supply are electrically connected to the second via conductor 133 for the power supply and the first internal electrode layer 141, and the electrode terminals 114, 124 for the ground are electrically connected to the second via conductor 134 for the ground and the second internal electrode layer 142, respectively.

The electrode terminals 111, 112, 113, 114 are principally comprised of nickel, and the surface thereof is entirely covered with a copper plating layer (not illustrated). Similarly, the electrode terminals 121, 122, 123, 124 are principally comprised of nickel, and the surface thereof is covered with the copper plating layer (not illustrated). In this embodiment, the diameter of the electrode terminals 111-114, 121-124 is about 500 μm, and the minimum pitch between the electrode terminals is about 580 μm.

When a voltage is applied to the first internal electrode layer 141 and the second internal electrode layer 142 through the electrode terminals 121, 122 (or the electrode terminal 123. 124) from the motherboard side, a positive charge will be produced in, for example, the first internal electrode layer 141, and a negative charge will be produced in, for example, the second internal electrode layer 142. As a result, the ceramic capacitors 100, 101 both function as a capacitor. Moreover, in the ceramic capacitor 100, the first via conductor 131 for the power supply and the first via conductor 132 for the ground are alternately adjacently disposed so that the direction of current flow through the first via conductor 131 for the power supply and the first via conductor 132 for the ground may be mutually reversed. Similarly, in the ceramic capacitor 101, the second via conductor 133 for the power supply and the second via conductor 134 for the ground are alternately adjacently disposed so that the direction of current flow through the second via conductor 133 for the power supply and the second via conductor 134 for the ground may be mutually reversed. As a result, a reduction in inductance is attained.

Further, a part of each first via conductor 131 for the power supply is electrically connected to the planar connection terminal 22 of the IC chip 20 through a first power supply conductive path formed by the first electrode terminal 111 for the power supply, the via conductor 47, the conductor layer 42, the via conductor 43, the terminal pad 44 and the solder bump 45. Similarly, a part of first via conductor 132 for the ground is electrically connected to the planar connection terminal 22 of the IC chip 20 through a first ground conductive path formed by the first electrode terminal 112 for the ground, the via conductor 47, the conductor layer 42, the via conductor 43, the terminal pad 44 and the solder bump 45. Thereby, a power supply connection is provided from the ceramic capacitor 100 to the IC chip 20.

Similarly, a part of each second via conductor 133 for the power supply is electrically connected to the planar connection terminal 22 of the IC chip 21 through a second power supply conductive path formed by the second electrode terminal 113 for the power supply, the via conductor 47, the conductor layer 42, the via conductor 43, the terminal pad 44 and the solder bump 45. A part of second via conductor 134 for the ground is electrically connected to the planar connection terminal 22 of the IC chip 21 through a second ground conductive path formed by the second electrode terminal 114 for the ground, the via conductor 47, the conductor layer 42, the via conductor 43, the terminal pad 44 and the solder bump 45. Thereby, a power supply connection is provided from the ceramic capacitor 101 to the IC chip 21.

Thus, in the wiring board 10 according to this embodiment, the IC chips 20, 21 each have an individual power supply system. Therefore, each of the ceramic capacitors 100, 101 is not only physically independent, but is also electrically independent, from the other.

Next, a method for manufacturing the wiring board according to the first embodiment will be described. In a preparatory step, the substrate core 11 and the ceramic capacitors 100, 101 are respectively produced in advance by using a conventionally known method.

Figure 5:
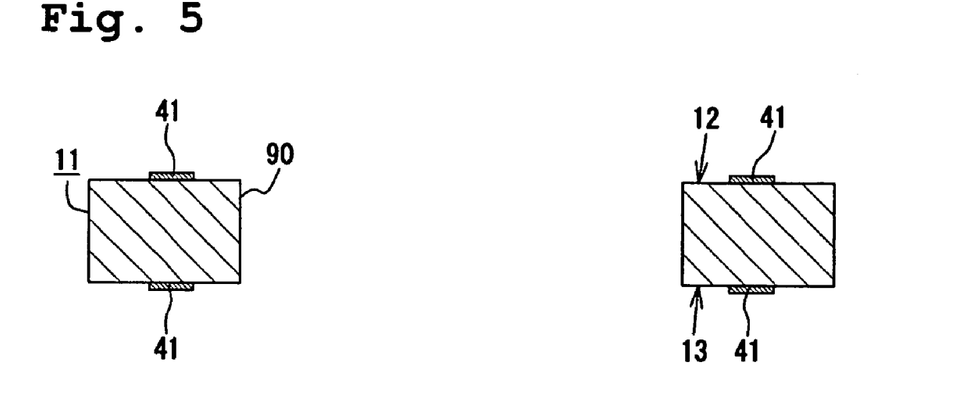
FIG. 5 depicts side elevational views used in explanation of a manufacturing method for a wiring board.

The substrate core 11 is produced as follows. First, a copper-clad laminated board in which a copper foil is laminated on both surfaces of a substrate having the dimensions of 400 mm (length)×400 mm (width)×0.8 mm (thickness) is prepared. In general, the thickness of the substrate is preferably 0.2 mm or more to 1.0 mm or less. Next, a boring operation is performed to the copper-clad lamination using a routing machine to form a through-hole in advance in the predetermined location, which serves as the housing opening portion 90 (refer to FIG. 5). The through-hole serving as the housing opening portion 90 is of a generally rectangular shape in cross-sectional with dimensions of 14.0 mm (lengthwise)× 30.0 mm (crosswise) and a radius R of 1.5 mm at the four corners. Then, the copper foil laminated on both surfaces of the copper-clad lamination board is etched to form the pattern of the conductor layer 41 by, for example, a subtractive method. More specifically, after performing the electroless copper plating, the electrolytic copper plating is applied thereto employing the electroless copper plating layer as a common electrode. Subsequently, a dry film is laminated on the thus-plated surface and subjected to exposure and development operation to thereby form predetermined pattern. In this process, any unnecessary portions of the electrolytic copper plating layer, electroless copper plating layer and copper foil are removed by etching. Then, the dry film is peeled to complete the substrate core 11.

The ceramic capacitors 100, 101 are preferably produced as follows. A ceramic green sheet comprised of ceramics is produced, and then a nickel paste for an internal electrode layer is screen-printed on the green sheet and dried. In this way, a first internal electrode portion serving as the first internal electrode layer 141 and a second internal electrode portion serving as the second internal electrode layer 142 are formed. Next, the green sheet in which the first internal electrode portion is formed and the green sheet in which the second internal electrode portion is formed are alternately laminated and pressed in the direction of lamination to thereby integrate the green sheets. As a result, a green sheet laminated body is formed.

A plurality of via holes 130 are then formed in the green sheet laminated body using a laser processing machine, and a nickel paste for via conductor is filled in each via hole 130 using a press-fit filling equipment (not illustrated). Next, a paste is printed on the upper surface of the green sheet laminated body to form the first electrode terminal 111 for the power supply and the first electrode terminal 112 for the ground (or the second electrode terminal 113 for the power supply and the second electrode terminal 114 for the ground) so as to cover the upper end face of each conductor portion at the upper side of the green sheet laminated body. Further, the paste is printed on the lower surface of the green sheet laminated body to form the first electrode terminal 121 for the power supply and the first electrode terminal 122 for the ground (or the second electrode terminal 123 for the power supply and the second electrode terminal 124 for the ground) so as to cover the lower end face of each conductor portion at the lower side of the green sheet laminated body.

Subsequently, the green sheet laminated body is dried so that a surface terminal portion may be solidified to some extent. Next, the green sheet laminated body is degreased and subjected to firing at a predetermined temperature for a predetermined time. As a result, the barium titanate and nickel contained in the paste are simultaneously sintered, thereby forming the ceramic sintered body 104.

Next, the electroless copper plating (about 10 µm in thickness) is applied to each of the electrode terminals 111, 112, 121, 122 (or each of the electrode terminals 113, 114, 123, 124) which are included in the ceramic sintered body 104. As a result, the copper plating layer is formed on each of the electrode terminals 111, 112, 121, 122 (or each of the electrode terminals 113, 114, 123, 124), thereby completing the ceramic capacitor 100 (or the ceramic capacitor 101). In addition, instead of applying a electroless copper plating, a electrolytic copper plating may be applied.

In a subsequent fixation step, two pieces or members forming ceramic capacitors 100, 101 are accommodated in the housing opening portion 90 using a mounting device (such as that made by Yamaha Motor Co., Ltd.) (refer to FIG. 6). At this time, an adhesive tape 152, which can be peeled, is employed to seal the lower surface side opening of the housing opening portion 90. The adhesive tape 152 is supported by a support board 151. Each ceramic capacitor 100, 101 is stuck onto, i.e., adhered to, an adhesive face 153 of the adhesive tape 152 to be temporarily fixed thereto.

Figure 6:
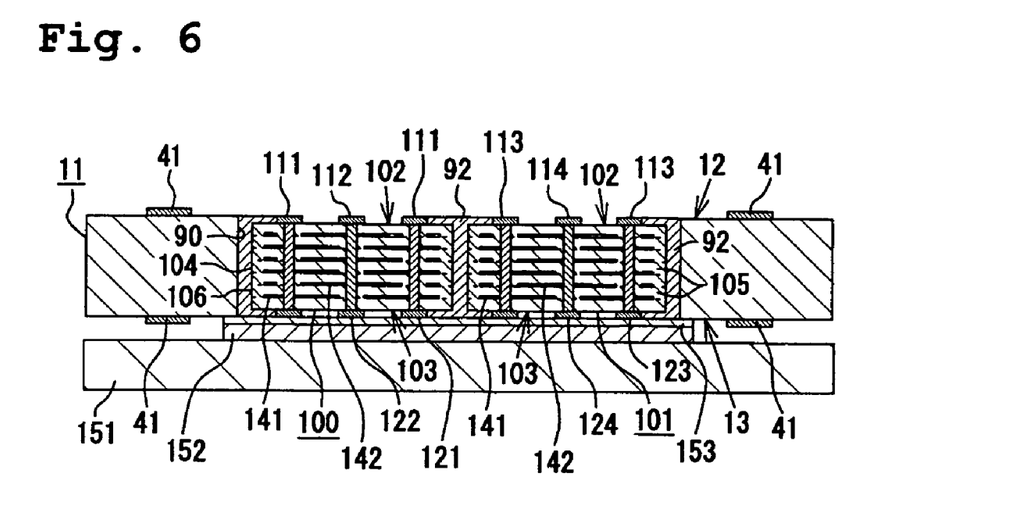
FIG. 6 is an cross-sectional view used in explanation of a manufacturing method of for wiring board.

In this state, the gap between the inner surface of the housing opening portion 90 and the side face 106 of the ceramic capacitor 100, 101, and the region between the adjacent ceramic capacitor 100,101 is filled with a filler 92 made of thermosetting resin (e.g., an underfill material, such as that made by Namix Co., Ltd.) using a suitable dispenser device (such as that made by Asymtek). Then, the filler 92 is hardened using a heat treatment to fix the ceramic capacitors 100, 101 to the housing opening portion 90. The adhesive tape 152 is peeled off at this time.

Figure 7:
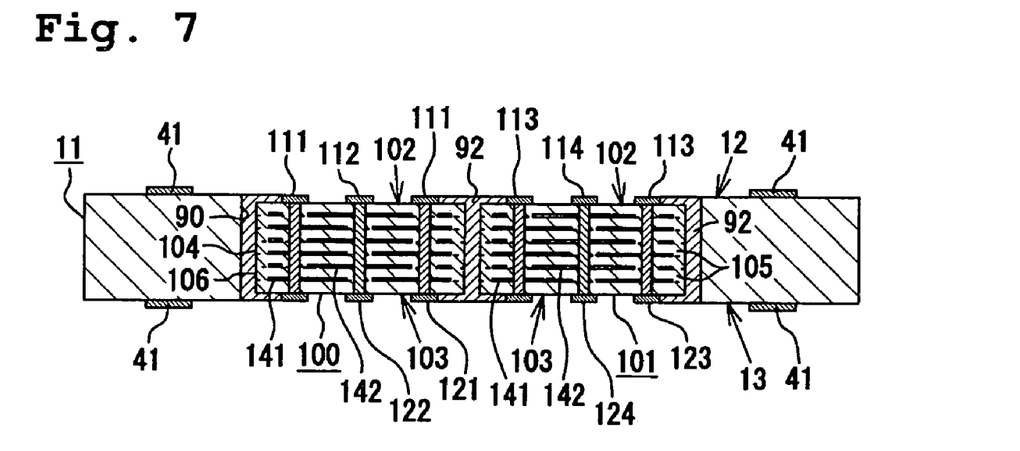
FIG. 7 is a further cross-sectional view used in explanation of a manufacturing method for a wiring board.

Subsequently, a built-up layer formation step is conducted. In the built-up layer formation step, the first built-up layer 31 is formed on the upper surface 12 and the upper surface 102, and the second built-up layer 32 is formed on the lower surface 13 and the lower surface 103, using a conventional, known method. As a result, the wiring board 10 comprised of the substrate core 11, and the built-up layers 31, 32 is completed. More specifically, while laminating a photosensitive epoxy resin on the upper surface 12 and the upper surface 102, the photosensitive epoxy resin is also laminated on the lower surface 13 and the lower surface 103. Then, an exposure and development operation are performed on thus-formed upper and lower surfaces to respectively produced resin insulating layers 33, 34 of the first layer. The resin insulating layers 33, 34 each include a blind via in a location where the via conductor 47 is formed. Further, a boring processing is performed using a YAG laser or a carbon dioxide laser to form a through-hole penetrating substrate core 11 and the resin insulating layers 33, 34. Then, after forming a through-hole conductor 16 by performing electroless copper plating and electrolytic copper plating in accordance with the conventional, known methods, a plugging body 17 is filled in the through-hole conductor 16. Subsequently, the electrolytic copper plating is performed in accordance with the conventional, known method (e.g., a semiadditive method) so as to form the via conductor 47 inside of the blind via, as well as forming the conductor layer 42 serving as a second layer on the resin insulating layers 33, 34 serving as the first layer.

Next, the photosensitive epoxy resin is laminated on the resin insulating layers 33, 34 serving as the first layer, and an exposure and development operation is performed to form the resin insulating layers 35, 36 of a second layer which has a blind via at the location where the via conductor 43 is formed. Then, the electrolytic copper plating is applied in accordance with the conventional, known method to form the via conductor 43 inside of the blind via and to form a terminal pad 44 on the resin insulating layer 35 serving as the second layer, and a pad 48 for BGA is formed on the resin insulating layer 36 serving as the second layer.

Subsequently, solder resist layers 37, 38 are respectively formed on the resin insulating layers 35, 36 serving as the second layer by applying photosensitive epoxy resin and providing curing thereof. Next, the exposure and development operations are performed so that a predetermined mask is provided so as to pattern-print openings 40, 46 on the solder resist layers 37, 38. Further, a solder bump 45 is formed on the terminal pad 44, and a solder bump 49 is formed on the pad 48 for BGA. This completes the wiring board 10 comprised of the substrate core 11 and the built-up layers 31, 32.

According to the this embodiment, the following effects and advantages can be attained.

Figure 9:
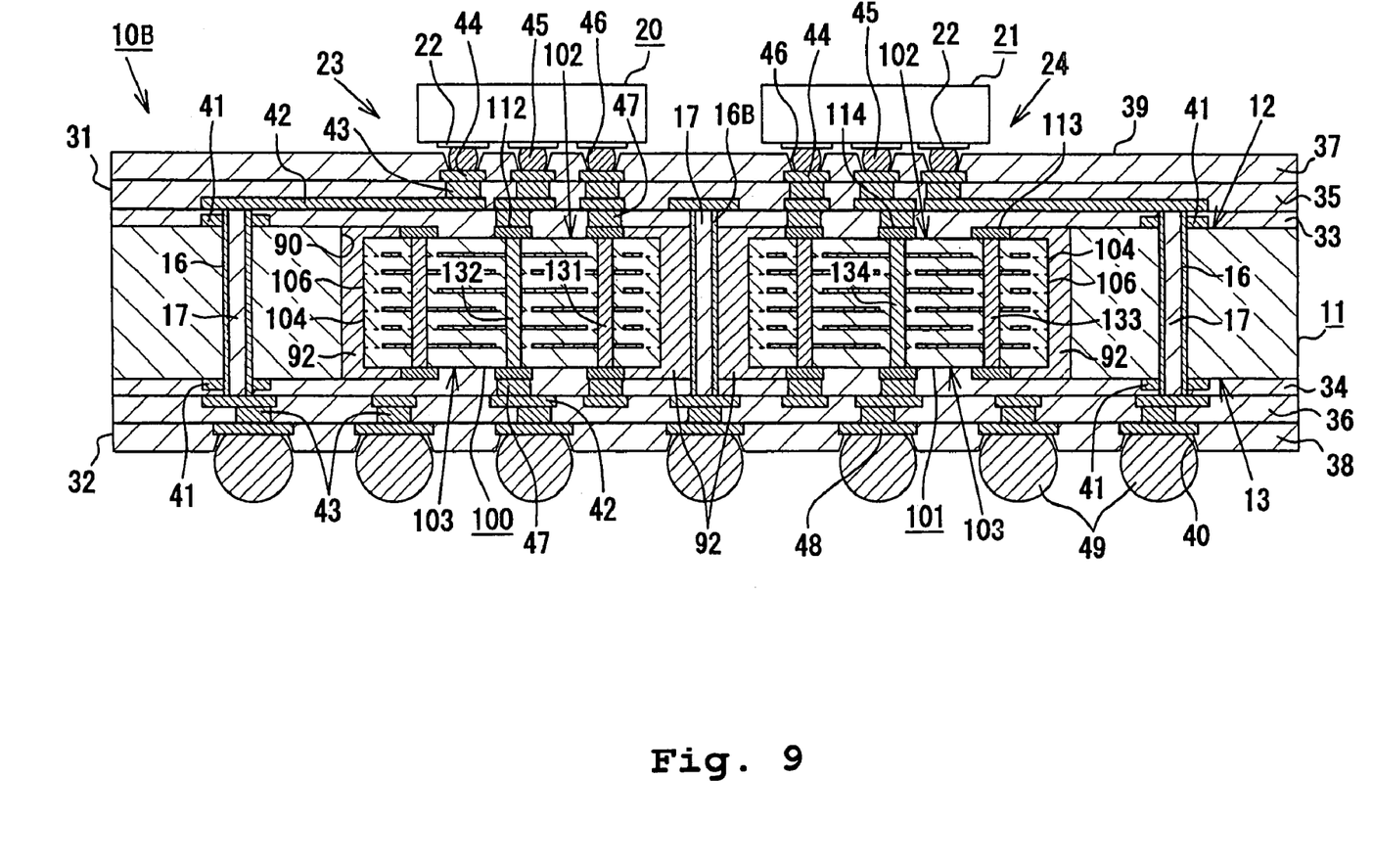
FIG. 9 is a schematic cross-sectional view showing a ceramic capacitor according to another embodiment.

In the wiring board 10 according to this embodiment, two locations for the IC chip mounting areas 23, 24 are provided in the first built-up layer 31, and, in the substrate core 11, two pieces of ceramic capacitors 100, 101 are disposed in each area corresponding to the IC chip mounting areas 23, 24, respectively. Thus, for example, a conductor body, such as a through-hole conductor 16B (refer to FIG. 9) may be formed in the area formed between the ceramic capacitors 100, 101, thereby resulting in an efficient and effective use of the inside area of the wiring board 10. Further, even though the wiring board 10 has a so-called "multi-microprocessor" structure where two pieces of IC chips 20, 21 are mounted, the conductor layer for electrically connecting the top and rear surfaces of the substrate core 11 can also be formed, thereby increasing the design flexibility. As a result, a reduction in the overall size of the wiring board 10 and in the cost thereof can be achieved.

Further, even in a case where the power supply system of each of the IC chips 20, 21 cannot be shared and an individual power supply system for each IC chip 20, 21 is necessary, each IC chip 20, 21 is fully operational because the two pieces of ceramic capacitors 100, 101 are electrically connected to the IC chip mounting areas 23, 24, respectively. Therefore, when adopting the multi-microprocessor structure similar to that of this embodiment, the advantages of such structure can be fully realized.

In this embodiment, since the IC chip mounting areas 23, 24 in the first built-up layer 31 are respectively located directly above the corresponding ceramic capacitors 100, 101, each of the IC chip mounting areas 23, 24 is supported by the corresponding ceramic capacitor 100, 101 which possesses high rigidity and a small coefficient of thermal expansion. Therefore, in the IC chip mounting areas 23, 24, the IC chips 20, 21, which are mounted on the IC chip mounting areas 23, 24, respectively, are more stably supported because the first built-up layer 31 is unlikely to deform. Thus, cracking and faulty electrical connection of the IC chips 20, 21 resulting from heat stress can be prevented. Therefore, a large-scale IC chip, i.e., a chip with dimensions of 10 mm×10 mm or more, which normally tends to be greatly influenced by thermal stress and has a high calorific power, or an IC chip of low-k (lower dielectric constant), which is fragile and also tends to be greatly influenced by thermal stress, can be employed as the IC chips 20, 21.

Further, since the wiring board 10 according to the present embodiment has two pieces of ceramic capacitors 100, 101, a power supply can be successfully implemented for each IC chip 20, 21 while removing noise at each ceramic capacitor 100, 101. Further, each IC chip 20, 21 is respectively mounted on each IC chip mounting area 23, 24, and disposed directly above each ceramic capacitor 100, 101. Thereby, the length of the electrical connection path (i.e., the length of capacitor connection wiring), which electrically connects each IC chip 20, 21 and each ceramic capacitor 100, 101 can be minimized. Therefore, the power supply to each IC chip 20, 21 is effectively performed. As a result, noise arising between the IC chips 20, 21 and each ceramic capacitor 100, 101 can be significantly reduced, and high reliability is attained without producing any faults or malfunctions.

Japanese Patent Application Laid-Open (kokai) No. 2002-43754 discloses an arrangement in which a plurality of chip capacitors are embedded in the substrate core. However, even though plural chip capacitors are provided, features and advantages attained by a stabilization of the power supply and the like are unlikely to be obtained with the construction disclosed in this reference. Further, since the upper surface area of the chip capacitor is much smaller than the IC chip mounting area, the chip capacitor cannot serve as a support body for the corresponding IC chip.

In contrast, because a via array type of ceramic capacitor (capacitors 100, 101) with large electrical capacity, instead of a mere chip capacitor, is used in the embodiment of the invention discussed above, important features and advantages are attained. The dimension of the IC chip mounting areas 23, 24 is smaller than that of the upper surface 102 of the corresponding ceramic capacitors 100, 101 in this embodiment. In other words, ceramic capacitors 100, 101 are used which have a larger area than the IC chip mounting areas 23, 24. Further, as viewed in the thickness direction, the IC chip mounting areas 23, 24 are located in the upper surface 102 of the ceramic capacitors 100, 101. Therefore, the ceramic capacitors 100, 101 can function as a support body for the IC chips 20, 21.

It is noted that a chip capacitor can be used instead of the ceramic capacitors 100, 101 and can be disposed at a rear side (i.e., a top or outer surface side of a second built-up layer 32) of the IC chips 20, 21 in the wiring board 10. In an example, the inductance of the chip capacitor is 7.2 pH and that of the electrical path connecting the chip capacitor and the IC chips 20, 21 is 2.8 pH. Thus, the total inductance is 10.0 pH, which is a relatively large value.

On the other hand, a ceramic capacitor (corresponding to capacitors 100, 101) having a lower inductance (1.2 pH) than that of a chip capacitor is used in the present, preferred embodiment. Because the ceramic capacitors 100, 101 are embedded in the substrate core 11, the length of the electric path connecting the ceramic capacitors 100, 101 and the IC chips 20, 21 is shorter than that of the electrical path for connecting the chip capacitors of the example above and the IC chips 20, 21. In this regard, the inductance of the electrical path is as low as 0.6 pH. Thus, the total inductance is 1.8 pH and the inductance component can be reduced as compared with the case where a chip capacitor is used. Thus, the supply of power is smooth, and a noise generation can be prevented.

Finally, in the ceramic capacitor 100 according to this first embodiment, a plurality of first via conductors 131 for the power supply and a plurality of first via conductors 132 for the ground are disposed in an overall array form. Similarly, in the ceramic capacitor 101 according to this embodiment, a plurality of second via conductors 133 for the power supply, and a plurality of second via conductors 134 for the ground, are disposed in an overall array form. In other words, the ceramic capacitor 100, 101 is a via-array type of capacitor. As a result, the size of the ceramic capacitors 100, 101 can be reduced, hereby resulting in a reduction in the overall size of the wiring board 10. Further, despite its compact size, a large electrical capacitance may be relatively easily achieved, thereby producing a more stable power supply.

Next, a further embodiment of a wiring board according to the present invention will be described in detail with reference to the drawings.

Figure 8:
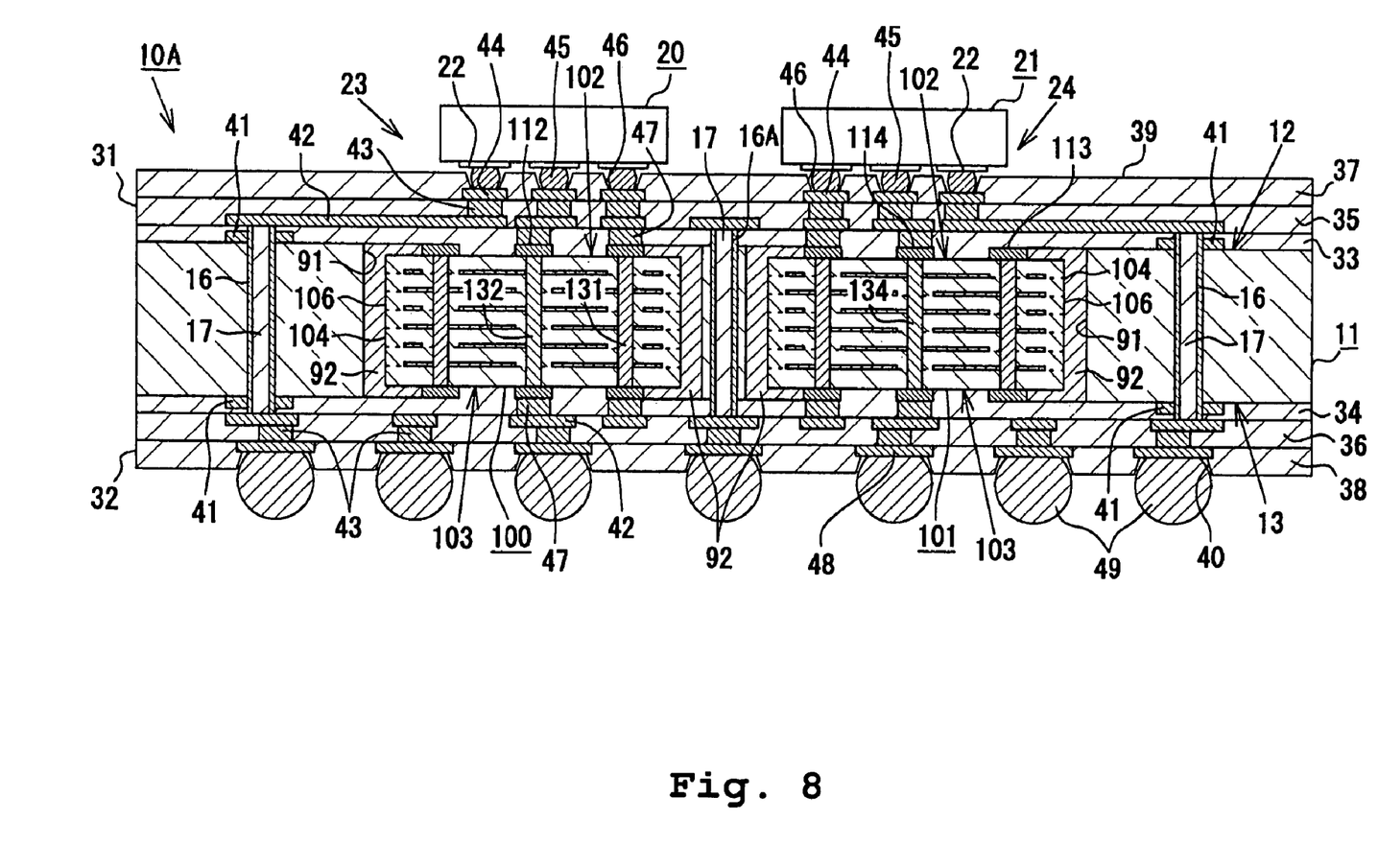
FIG. 8 is a cross-sectional view showing a ceramic capacitor according to a second embodiment of the invention.

As shown in FIG. 8, a wiring board 10A according to this embodiment includes two housing opening portions 91 which open at the upper surface 12 of the substrate core 11. Each ceramic capacitor 100, 101 is respectively accommodated in each housing opening portion 91 and oriented such that the upper surface 12 and the upper surface 102 face the same side, i.e., in thee same direction. In addition to the through-hole conductor 16 described in connection with the first embodiment, the substrate core 11 includes a through-hole conductor 16A (conductor portion) disposed in an area formed between the adjoining housing opening portions 91. The inside of the through-hole conductors 16, 16A is filled with, for example, a plugging body 17 such as an epoxy resin. The upper end of the through-hole conductors 16, 16A is electrically connected to the conductor layer 42 formed on the resin insulating layer 33 of the first built-up layer 31, and the lower end of the through-hole conductors 16, 16A is electrically connected to the conductor layer 42 formed on the resin insulating layer 34 of the second built-up layer 32. Thus, the through-hole conductors 16, 16A function to electrically connect the first built-up layer 31 and the second built-up layer 32. The through-hole conductor 16A formed between the adjoining housing opening portions 91 is formed simultaneously with other through-hole conductors 16, using the same method as that of the through-hole conductors 16 of the first embodiment.

As a result of the construction of this embodiment, a space for forming the through-hole conductor 16A can be easily obtained or provided in the area formed between the adjoining ceramic capacitors 100, 101. Accordingly, even though the multi-microprocessor structure is adopted in which two pieces or members of IC chips 20, 21 are mounted, the wiring of the conductor layer used in electrically connecting the top and rear surfaces of the substrate core 11 can be readily formed or carried out.

Further, by forming the through-hole conductor 16A in the area formed between the adjoining ceramic capacitors 100, 101, it is not necessary for any conductor provided for signals to be formed in the ceramic capacitors 100, 101 or in the substrate core 11. Therefore, miniaturization of the ceramic capacitors 100, 101 and/or the substrate core 11 may be facilitated. Further, miniaturization of ceramic capacitors 100, 101 contributes to easy formation of the through-hole conductor 16A because enough space is provided for forming the through-hole conductor 16A.

It is noted that each embodiment of the present invention described above may be modified as follows.

In the first embodiment, a conductor portion, such as a through-hole conductor 16B (see the wiring board 10B in FIG. 9) may be formed in the filler 92 which fills the area formed between the adjoining ceramic capacitors 100, 101. This constructions facilitates wiring of the conductor layer for electrically connecting the rear and top surfaces of the substrate core 11. The through-hole conductor 16B in the filler 92 is preferably formed as follows. In this implementation, a through-hole penetrating the substrate core 11 and the resin insulating layer 33, 34 and a through-hole penetrating the filler 92 are formed simultaneously using a laser boring process. Then, an electroless copper plating and an electrolytic copper plating are applied by conventional, known methods so as to form the through-hole conductor 16B in the filler 92 which fills the area formed between the ceramic capacitors 100, 101.

The housing opening portion 90, 91 of each embodiment described above is a through-hole portion which opens at the upper surface 12 and the lower surface 13 of the substrate core 11. However, the housing opening portions 90, 91 may instead be a concave portion with a bottom (i.e., a non-through-hole portion), which opens only at the upper surface 12 of the substrate core 11.

A wiring pattern (i.e., an inner layer pattern) may be formed in the substrate core 11 according to each of the embodiments described above. With this construction, a complex electrical circuit can be formed inside of the wiring board 10, thereby facilitating the provision of much more advanced features of the wiring board 10. Further, the substrate core 11 may be formed in such a manner that a thin insulating layer is laminated on the core.

Figure 10:
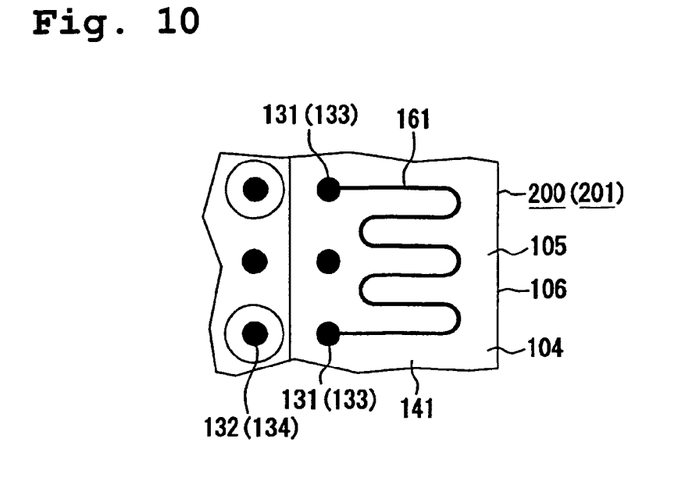
FIG. 10 is a schematic plan view, partially broken away, of a ceramic capacitor showing an area in the vicinity of a resistive element, according to another embodiment.
Figure 11:
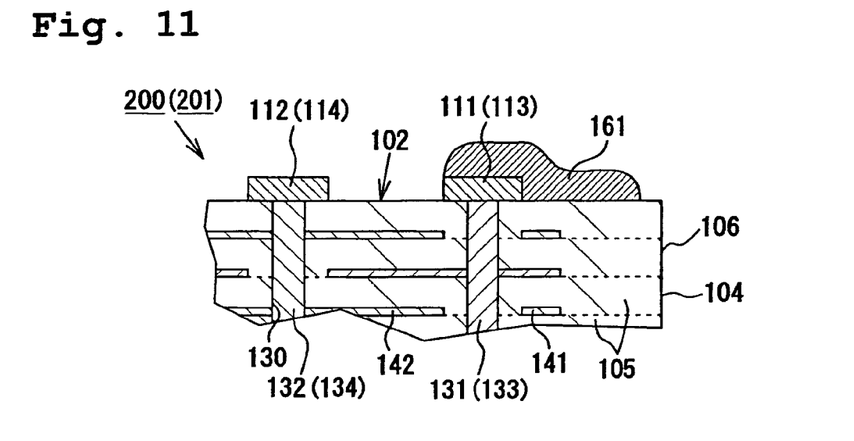
FIG. 11 is a schematic cross-sectional view, partially broken away, of a ceramic capacitor showing an area in the vicinity of resistive element.
Figure 12:
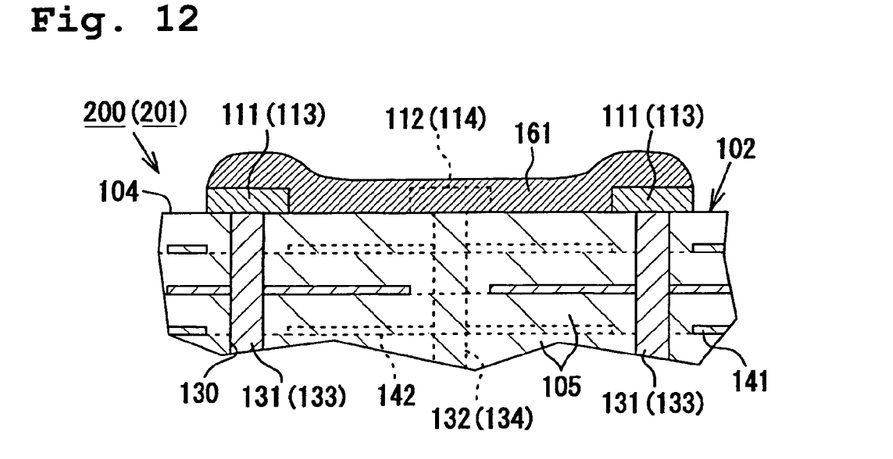
FIG. 12 is a schematic cross-sectional view, partially broken away, of a ceramic capacitor showing an area in the vicinity of resistive element.

As shown in FIGS. 10-12, a resistive element 161 may be formed on an upper surface 102 or the like of a ceramic capacitor 200 or 201. For example, the resistive element 161 can be used to electrical connect a first electrode terminal 111 for the power supply (second electrode terminal 113 for the power supply) and the other first electrode terminal 111 for the power supply (second electrode terminal 113 for the power supply). Preferably, the resistive element 161 is comprised of ceramics having a higher resistance than that of a material constituting the electrode terminals 111, 113 for the power supply, the first inner electrode layer 141 and the second inner electrode layer 142. The resistive element 161 is preferably formed by a method wherein, for example, after completion of the ceramic capacitors 200, 201, a ceramic paste is applied to the upper surface side (the side of upper surface 102) and fired for a predetermined duration, and then resistance value or the like is adjusted by removing a portion of the paste to provide the desired value.

With this construction, a different electrical potential can be established in, for example, the same ceramic capacitor 200 or 201, thereby facilitating advanced features of the wiring board 10. When no resistive element is formed in the ceramic capacitors 200, 201, the resistive element is necessarily embedded in a location in the substrate core 11 other than in the ceramic capacitor 200, 201, or formed at the side of the respective built-up layers 31, 32.

A plurality of "dummy-via" electrodes (also referred to as a ground via electrode) may be disposed between the ceramic capacitors 100, 101. With this construction, noise caused by interference between the ceramic capacitor 100 and the ceramic capacitor 101 can be reduced more. Specifically, when the ceramic capacitors 100, 101 contain a large capacitance portion and the small capacitance portion whose capacitance is smaller than that of the large capacitance portion, it is preferable to provide plural dummy-via electrodes (ground via electrodes) between the large capacitance portion and the small capacitance portion. As a result, noise generated in the small capacitance portion, which is susceptible to interference from the large capacitance portion, can be reduced. Further, to provide heat dissipation, a plurality of dummy-via electrodes (ground via electrodes) may be disposed in a location surrounding the ceramic capacitors 100, 101.

Figure 13:
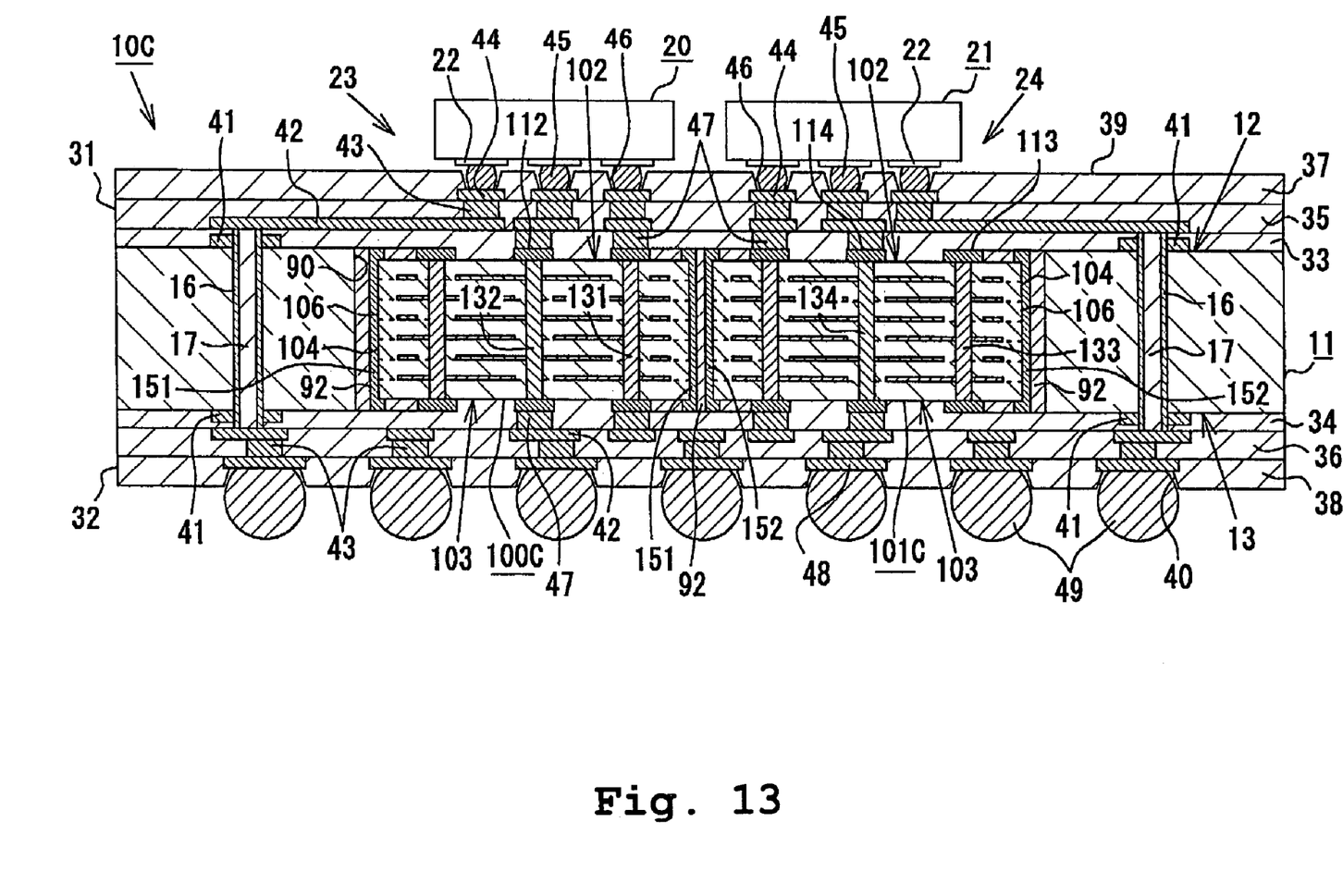
FIG. 13 is a schematic cross-sectional view showing a wiring board according to another embodiment.

Similarly, in a wiring board 10C according to another embodiment shown in FIG. 13, side face dummy electrodes 151, 152 may be formed in a face (i.e., side face 106) other than the upper surface 102 and the lower surface 103 of the ceramic capacitors 100C, 101C. Similarly to the above embodiment, this construction also contributes to a reduction in noise caused by interference between the ceramic capacitors 100C, 101C. The side face dummy electrodes 151, 152 shown in FIG. 13 may be a conductor which is not electrically connected to any conductor layers. However, preferably, the side face dummy electrodes 151, 152 are electrically connected to, for example, the conductor layer for the ground in the built-up layers 31, 32. With this construction, the shielding effectiveness can be improved, it is noted that such side face dummy electrodes 151, 152 are preferably comprised of, for example, the same metal material as that of the electrode terminal provided in the ceramic capacitors 100C, 101C.

Figure 14:
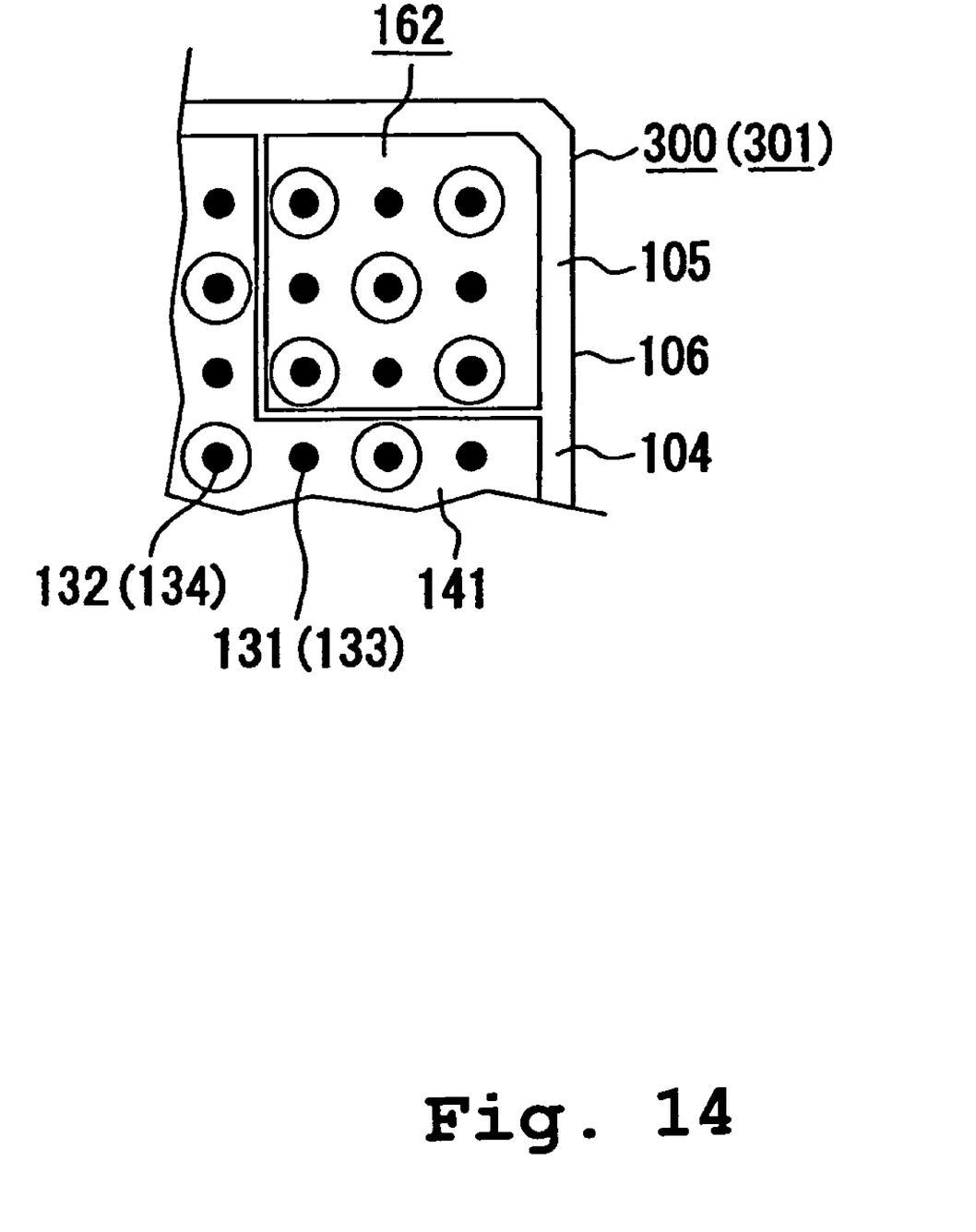
FIG. 14 is a schematic plan view, partially broken away, of a ceramic capacitor showing an area in the vicinity of capacitor portion, according to another embodiment.

As shown in FIG. 14, a capacitor portion 162 of a separate system (for the power supply to I/O or the like) other than for the IC chip 20, 21 may be formed in a part of ceramic capacitors 300, 301. This structure allows the wiring board 10 to have more advanced features.

Although the invention has been described above in relation to preferred embodiments thereof, it will be understood by those skilled in the art that variations and modifications can be effected in these preferred embodiments without departing from the scope and spirit of the invention.

What is claimed:

1. A wiring board comprising:
   a substrate core including a core main surface and a core rear surface;
   a plurality of ceramic capacitors each including a capacitor main surface and comprising an alternatively laminated structure including a first inner electrode layer and a second inner electrode layer which sandwich a ceramic dielectric layer therebetween, said ceramic capacitors being embedded in said substrate core and being oriented such that said core main surface and said capacitor main surface face in a common direction; and
   a built-up layer having a laminated structure wherein at least one interlayer insulating layer and at least one conductor layer are alternately laminated on said core main surface and said capacitor main surface, said built-up layer including a plurality of semiconductor integrated circuit element mounting areas at different locations on a surface of said built-up layer, and
   said plurality of ceramic capacitors being disposed in areas of said substrate core corresponding to said plurality of semiconductor integrated circuit element mounting areas,
   said substrate core including a plurality of housing opening portions therein which open at said core main surface, and
   said ceramic capacitors being respectively accommodated in said plurality of housing opening portions and being oriented such that said core main surface and said capacitor main surface face in a common direction,
   said substrate core further including a conductor portion which electrically connects said core main surface side and said core rear surface side and which is disposed in an area formed between said adjacent housing opening portions.

2. A wiring board according to claim 1,
   wherein said semiconductor integrated circuit element mounting area has a dimension no greater than the corresponding dimension of said capacitor main surface of the corresponding ceramic capacitor, and
   wherein said at least one semiconductor integrated circuit element mounting area is located within said capacitor main surface of the corresponding ceramic capacitor, as viewed in the thickness direction of said ceramic capacitor.

3. A wiring board according to claim 1,
   wherein the dimensions of at least one said semiconductor integrated circuit element mounting area are between about 50% and 90% of the dimensions of said capacitor main surface of the corresponding ceramic capacitor.

4. A wiring board according to claim 1,
   wherein said built-up layer comprises a first built-up layer and
   wherein said wiring board includes a second built-up layer having an alternately laminated structure wherein at least one interlayer insulating layer and at least one conductor layer are alternately laminated on said core rear surface and said capacitor rear surface.

5. A wiring board according to claim 1,
   wherein at least one of said ceramic capacitors includes a side face dummy electrode facing an adjoining ceramic capacitor of said plurality of ceramic capacitors.

6. A wiring board according to claim 5, further comprising a conductor layer serving as ground in a built-up layer, and
   wherein said side face dummy electrode is electrically connected to said conductor layer.

7. A wiring board comprising:
   a substrate core including a core main surface and a core rear surface;
   a plurality of ceramic capacitors each including a capacitor main surface and comprising an alternatively laminated structure including a first inner electrode layer and a second inner electrode layer which sandwich a ceramic dielectric layer therebetween, said ceramic capacitors being embedded in said substrate core and being oriented such that said core main surface and said capacitor main surface face in a common direction; and
   a built-up layer having a laminated structure wherein at least one interlayer insulating layer and at least one conductor layer are alternately laminated on said core main surface and said capacitor main surface, said built-up layer including a plurality of semiconductor integrated circuit element mounting areas at different locations on a surface of said built-up layer, and
   said plurality of ceramic capacitors being disposed in areas of said substrate core corresponding to said plurality of semiconductor integrated circuit element mounting areas,
   wherein said substrate core includes a housing opening portion therein which opens at said core main surface, and
   wherein said ceramic capacitors are accommodated in said housing opening portion and are oriented such that said core main surface and said capacitor main surface face in a common direction,
   said wiring board further comprising a filler filling an area formed between adjacent ceramic capacitors, and a conductor portion, formed in said filler, for electrically connecting said core main surface side and said core rear surface side.

8. A wiring board according to claim 7,
   wherein said semiconductor integrated circuit element mounting area has a dimension no greater than the corresponding dimension of said capacitor main surface of the corresponding ceramic capacitor, and
   wherein said at least one semiconductor integrated circuit element mounting area is located within said capacitor main surface of the corresponding ceramic capacitor, as viewed in the thickness direction of said ceramic capacitor.

9. A wiring board according to claim 7,
   wherein the dimensions of at least one said semiconductor integrated circuit element mounting area are between about 50% and 90% of the dimensions of said capacitor main surface of the corresponding ceramic capacitor.

10. A wiring board according to claim 7,
    wherein said built-up layer comprises a first built-up layer and
    wherein said wiring board includes a second built-up layer having an alternately laminated structure wherein at least one interlayer insulating layer and at least one conductor layer are alternately laminated on said core rear surface and said capacitor rear surface.

11. A wiring board according to claim 7,
    wherein at least one of said ceramic capacitors includes a side face dummy electrode facing an adjoining ceramic capacitor of said plurality of ceramic capacitors.

* * * * *